(12) United States Patent
Lin et al.

(10) Patent No.: US 8,889,017 B2
(45) Date of Patent: Nov. 18, 2014

(54) METHOD FOR PRODUCING SILICON WAVEGUIDES ON NON-SOI SUBSTRATE

(75) Inventors: Ching-Fuh Lin, Taipei (TW); Shih-Che Hung, Taipei (TW); Shu-Jia Syu, Taipei (TW)

(73) Assignee: National Taiwan University, Taipei (TW)

( * ) Notice: Subject to any disclaimer, the term of this patent is extended or adjusted under 35 U.S.C. 154(b) by 99 days.

(21) Appl. No.: 13/458,900

(22) Filed: Apr. 27, 2012

(65) Prior Publication Data

US 2013/0095659 A1     Apr. 18, 2013

(30) Foreign Application Priority Data

Oct. 12, 2011  (TW) .............................. 100137067 A

(51) Int. Cl.
    *H01L 21/02*       (2006.01)
    *G02B 6/136*       (2006.01)
    *G02B 6/12*        (2006.01)

(52) U.S. Cl.
    CPC ........... *G02B 6/136* (2013.01); *H01L 21/02381* (2013.01); *H01L 21/02675* (2013.01); *H01L 21/02532* (2013.01); *G02B 2006/12061* (2013.01)
    USPC .......... 216/11; 216/24; 438/691; 257/E21.002

(58) Field of Classification Search
    None
    See application file for complete search history.

(56) References Cited

U.S. PATENT DOCUMENTS

| | | | | |
|---|---|---|---|---|
| 4,902,086 A | * | 2/1990 | Henry et al. ................... | 385/130 |
| 5,039,190 A | * | 8/1991 | Blonder et al. ................ | 359/342 |
| 5,064,266 A | * | 11/1991 | Sun et al. ...................... | 385/132 |
| 5,230,990 A | * | 7/1993 | Iwasaki et al. ................ | 430/321 |
| 5,246,733 A | * | 9/1993 | Springer et al. .............. | 427/162 |
| 5,546,480 A | * | 8/1996 | Leonard ............................. | 385/3 |
| 5,846,694 A | * | 12/1998 | Strand et al. .................. | 430/321 |
| 7,179,728 B2 | * | 2/2007 | Kaneko et al. ................ | 438/492 |
| 7,336,881 B2 | * | 2/2008 | Cho .............................. | 385/129 |
| 7,410,749 B2 | * | 8/2008 | Cho et al. ..................... | 430/321 |
| 2004/0218889 A1 | * | 11/2004 | Shelnut et al. ................ | 385/143 |
| 2010/0295083 A1 | * | 11/2010 | Celler ............................ | 257/98 |
| 2011/0164642 A1 | * | 7/2011 | Onishi et al. ............ | 372/46.012 |
| 2013/0095659 A1 | * | 4/2013 | Lin et al. ....................... | 438/691 |
| 2013/0107900 A1 | * | 5/2013 | Hayakawa ........................ | 372/36 |
| 2013/0195401 A1 | * | 8/2013 | Witzens ............................ | 385/14 |

OTHER PUBLICATIONS

Hung et al. "Formation of Cylindrical Profile of Si by KrF Excimer Laser System for Optical Interconnect" IEEE Nano Conference (Portland) (oral presentation), Aug. 15-19, 2011 (4 pages).
Hung et al. "Circular Si Waveguides from Bulk Si by Using Laser Reformation Technique" SPIE Optics + Photonics Conference (San Diego) (oral presentation), Aug. 21-25, 2011 (6 pages).
Lin, Ching-Fuh "Fabrication of Si Waveguides from a Regular Si Wafer Exploiting Laser Reformation Technique" National Taiwan University Newsletter, Aug. 9, 2011, Abstract only.

* cited by examiner

*Primary Examiner* — Allan Olsen
(74) *Attorney, Agent, or Firm* — Donald E. Stout; Stout, Uxa & Buyan, LLP

(57) ABSTRACT

The present invention relates to a method for producing silicon waveguides on non-SOI substrate (non-silicon-on-insulator substrate), and particularly relates to a method for producing silicon waveguides on silicon substrate with a laser. This method includes the following steps: (1) forming a ridge structure with high aspect ratio on a non-SOI substrate; (2) melting and reshaping the ridge structure by laser illumination for forming a structure having broad upper part and narrow lower part; and (3) oxidizing the structure having broad upper part and narrow lower part to form a silicon waveguide.

25 Claims, 5 Drawing Sheets

US 8,889,017 B2

METHOD FOR PRODUCING SILICON WAVEGUIDES ON NON-SOI SUBSTRATE

CROSS-REFERENCE TO RELATED APPLICATIONS

The entire contents of Taiwan Patent Application No. 100137067, filed on Oct. 12, 2011, from which this application claims priority, are incorporated herein by reference.

BACKGROUND OF THE INVENTION

1. Field of the Invention

The present invention relates to a method for producing silicon waveguides on non-SOI substrate (non-silicon-on-insulator substrate), and particularly relates to a method for producing crystalline silicon waveguides on silicon substrate with a laser.

2. Description of Related Art

Generally, silicon photonic devices, and particularly crystalline silicon photonic devices, such as silicon waveguides, need to be produced on silicon-on-insulator substrate (SOI substrate) rather than on common silicon wafer or silicon substrate. Comparing with common silicon substrate (or silicon wafer), the process for manufacturing the SOI substrate is more complicated and difficult, and the cost for manufacturing the SOI substrate is relatively higher. It results that the cost for manufacturing silicon photonic devices cannot be reduced.

Furthermore, with increasing of efficiency of microprocessors, requirement for throughput and transmission speed of data between ICs and inside an IC is increased. Therefore, it is a good alternative scheme obviously that a silicon photonic device is used as an optical connection between ICs and between semiconductor devices in an IC instead of traditional metal circuit which is used to be data transmission between ICs and between electronic devices (or semiconductor devices) in an IC. However, the crystalline silicon photonic device (particularly the crystalline silicon photonic device) cannot be produced on silicon substrate (or silicon wafer), so the electronic devices or the semiconductor devices, such as CMOS, and the silicon photonic devices, such as silicon waveguides need to be respectively produced on silicon substrate and SOI substrate. They are hardly integrated with each other and cannot be produced on the same substrate. Therefore, the process of this alternative scheme is too complicated and difficult, and the cost of this alternative scheme is too high so that they hinder the alternative from being practiced.

Accordingly, there is a need of a method for producing silicon photonic devices (particularly the crystalline silicon photonic device) on non-SOI substrate. Here, we provide a method to produced silicon photonic devices (particularly the crystalline silicon photonic device) on common silicon substrate (or silicon wafer) instead of the SOI substrate. It reduces the cost for producing the silicon photonic devices. Furthermore, the silicon photonic devices and the electronic devices (or semiconductor device) can be integrated on the same silicon substrate.

SUMMARY OF THE INVENTION

In view of the foregoing, one object of the present invention is to provide a method for producing silicon photonic devices (such as silicon waveguides) on non-SOI substrate, and particularly a method for producing for the crystalline silicon photonic device on non-SOI substrate. In this method, a common silicon substrate (or silicon wafer) can be adopted to produce the silicon photonic devices. Therefore, the cost for producing the silicon photonic device can be decreased.

Another object of the present invention is to provide a method for producing silicon photonic devices (such as silicon waveguides) on non-SOI substrate, and particularly a method for producing for the crystalline silicon photonic device on non-SOI substrate. By this method, the silicon photonic device can be produced on a common silicon substrate (or silicon wafer), and the silicon photonic device and the electronic device (or semiconductor device) can be produced on the same silicon substrate. Therefore, the cost and difficulty for integrating the silicon photonic device and the electronic device (or semiconductor device) on the same silicon substrate can be reduced.

According to the objects above, a method for producing silicon waveguides on non-SOI substrate is disclosed herein. The method comprises following steps: (1) forming a ridge structure with high aspect ratio on a non-SOI substrate; (2) melting and reshaping the ridge structure by laser illumination for forming a structure having broad upper part and narrow lower part; and (3) oxidizing the narrow lower part of the structure and periphery part of the broad upper part of the structure to form a silicon waveguide.

Therefore, the present invention provides a method for producing silicon waveguides on non-SOI substrate. By this method, the silicon photonic device can be produced on common silicon substrate (or silicon wafer) instead of the SOI substrate for reducing the cost for producing the silicon photonic device. Furthermore, the present invention further provides a method for producing the silicon photonic device and the electronic device (or semiconductor device) on the same silicon substrate. By this method, the cost and difficulty for integrating the silicon photonic device and the electronic device (or semiconductor device) on the same silicon substrate can be reduced, and the silicon photonic device can be used as an optical connection between ICs and between semiconductor devices in an IC. Therefore, the difficulty of adopting the silicon photonic device to be throughput of data between ICs and between semiconductor devices in an IC is reduced, and the possibility of above-mentioned alternative scheme is increased.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed description of the present invention will be discussed in the following embodiments, which are not intended to limit the scope of the present invention, and can be adapted for other applications. While drawings are illustrated in detail, it is appreciated that the quantity of the disclosed components may be greater or less than that disclosed, except where expressly restricting the amount of the components. Although specific embodiments have been illustrated and described, it will be appreciated by those skilled in the art that various modifications may be made without departing from the scope of the present invention, which is intended to be limited solely by the appended claims.

Figure 1A:
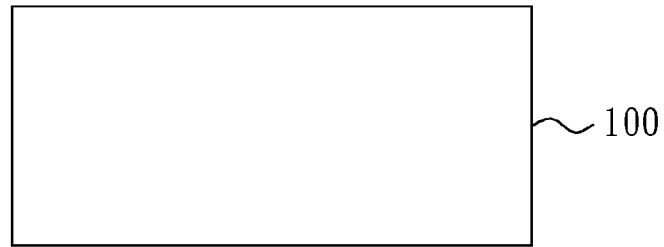
FIG. 1A to FIG. 1H are a series of cross-section drawings illustrating a method for producing silicon waveguides on non-SOI substrate in accordance with an embodiment of the present invention.

FIG. 1A to FIG. 1H illustrate a method for producing silicon waveguides (particularly the crystalline silicon waveguides) on non-SOI substrate in accordance with an embodiment of the present invention, and they illustrate all process and individual process step of this method with a series of cross-section drawings. Referring to FIG. 1A, first, a non-SOI substrate 100 is provided. The non-SOI substrate 100 is a silicon substrate or silicon wafer commonly used to produce electronic devices (or semiconductor devices).

Figure 1B:
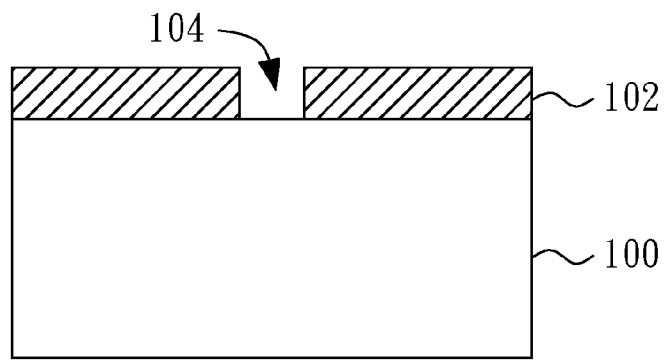

Next, referring to FIG. 1B, a photoresist 102 is formed or covered on the non-SOI substrate 100, and then, the photoresist 102 is patterned by photolithography and part of the photoresist 102 is removed to expose the surface of an area on the non-SOI substrate 100 for defining this area as predetermined area 104 for forming ridge structure and defining the width of the ridge structure. In other words, the width of the predetermined area 104 is the width of the ridge structure formed in following steps. Of course, a mask which has been patterned can be covered on the non-SOI substrate 100 directly for defining this area as the predetermined area 104 for forming ridge structures and defining the width of the ridge structure.

Figure 1C:
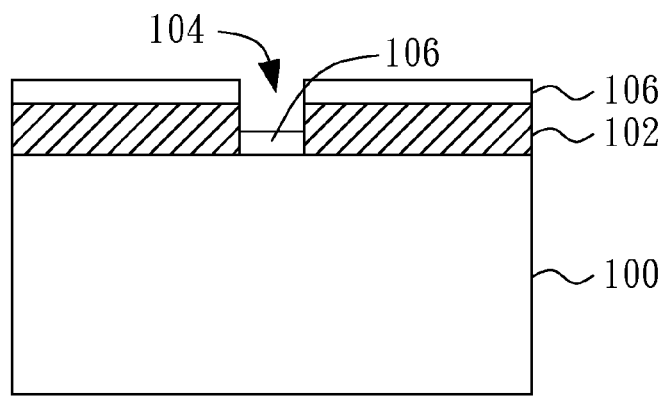

After, referring to FIG. 1C, a metal layer 106 is formed on the surface of the non-SOI substrate 100 in the predetermined area 104 and the photoresist 102. Of course, in this step, the metal layer can be formed only in the predetermined area 104 on the non-SOI substrate 100. The metal layer 106 is formed on the non-SOI substrate 100 by evaporation, sputtering, or other suitable method, and the metal layer 106 is composed of Chromium (Cr) or other metal which is suitable to be used as etching mask.

Figure 1D:
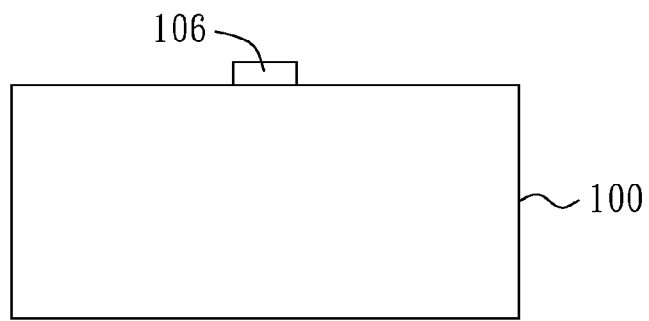
Figure 1E:
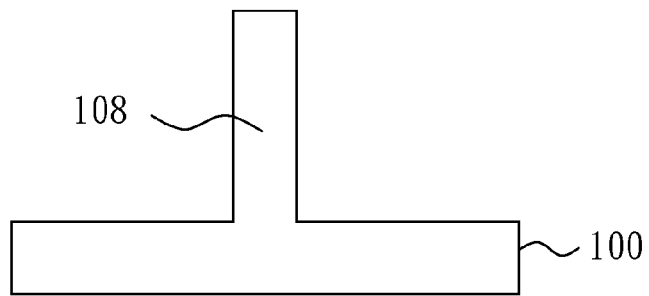
Figure 2A:
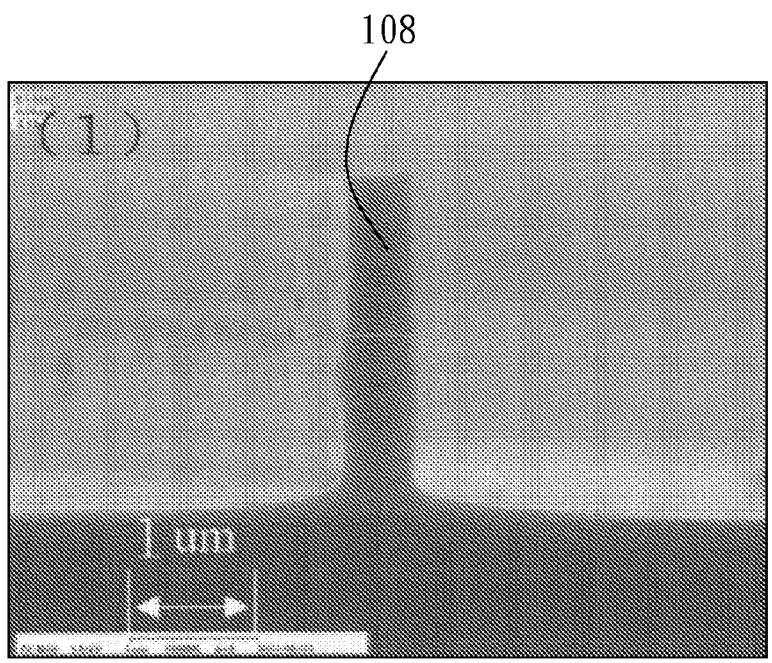
FIG. 2A to FIG. 2D are a series of electron microscope pictures illustrating cross-section structures in different steps of the method for producing silicon waveguides on non-SOI substrate in accordance with the embodiment shown in FIG. 1A to FIG. 1H.

Then, referring to FIG. 1D, the photoresist 102 and the metal layer 106 are removed but the metal layer 106 in the predetermined area 104 still remains. This step of removing the photoresist 102 can be performed by chemical etching, chemical mechanical polishing, or other method which is suitable to remove the photoresist. After, referring to FIG. 1E, an etching process is performed by using the remained metal layer 106 as an etching mask to remove the portions of the non-SOI substrate 100 which are uncovered by the metal layer 106 to a predetermined thickness in order to form a ridge structure 108 with high aspect ratio on the non-SOI substrate 100. Then, the remained metal layer 106, which is used as an etching mask, on the ridge structure 108 is removed, or the remained metal layer 106 is directly removed in the etching process. The predetermined thickness is the height of the ridge structure 108, and different predetermined thicknesses (or different heights of the ridge structures) can be adopted according to the size of the desired waveguide. The height of the ridge structure 108 is in a range of 100 nm to 10 μm, the width of the ridge structure 108 is in a range of 10 nm to 5 μm, and the aspect ratio of the ridge structure 108 is in a range of 1/50 to 1000. The different heights, widths, and aspect ratios of the ridge structure 108 can be adopted according to the size and design of the desired waveguide. The etching process is performed by wet etching, dry etching, reactive ion etching, laser assisted imprinting or laser cutting. Referring to FIG. 2A, it is an electron microscope picture of the cross-section structure of the ridge structure 108 which is formed through above-mentioned steps, and it illustrates the actual structure after the etching process.

Figure 1F:
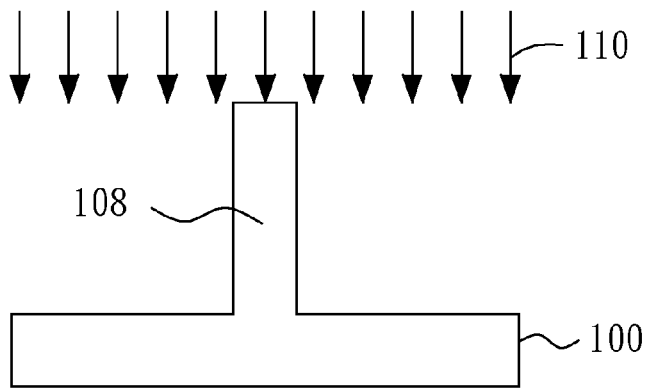
Figure 1G:
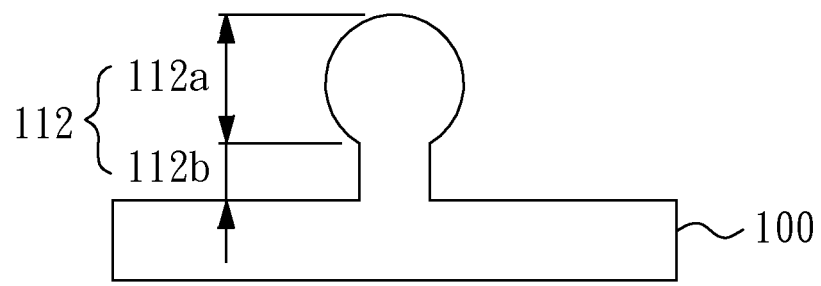
Figure 2B:
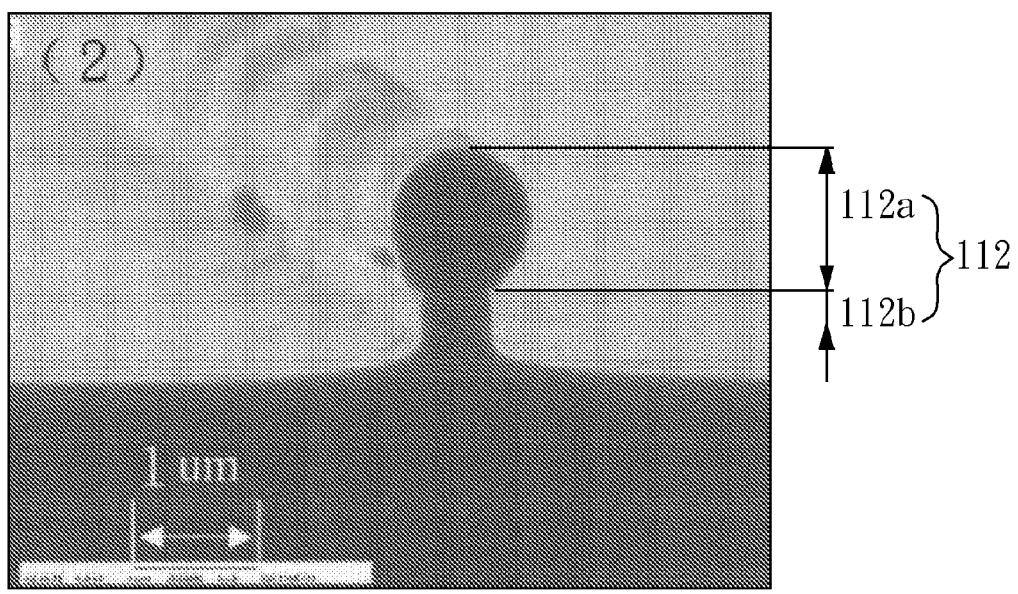

After, referring to FIG. 1F, a laser 110 illuminates the ridge structure 108, and particularly illuminates the upper part of the ridge structure 108. The ridge structure 108 (particularly the upper part of the ridge structure 108) is melted and reshaped by laser energy and illumination to form a structure 112 having broad upper part 112a and narrow lower part 112b (as shown in FIG. 1G). Referring to FIG. 2B, it is an electron microscope picture of the cross-section structure of the melted and reshaped ridge structure 108, and it illustrates the actual structure after the laser illumination.

In this step, the laser can be a gas laser, solid state laser, or diode laser, and the operation mode of the laser can be a pulse laser or continue-wave laser (CW laser). The irradiation or illumination direction of the laser 110 used in this step is in a range of 0 degree (the irradiation or illumination direction of the laser 110 is perpendicular to the non-SOI substrate 100) to 90 degree (the irradiation or illumination direction of the laser 110 is parallel to the non-SOI substrate 100). The irradiation or illumination direction of the laser 110 can be changed according to the requirement of process. The step of laser illumination can be performed in vacuum, atmosphere, noble gas or reactive gas (such as oxygen or nitrogen) according to the requirement of process. In addition, the laser 110 can be homogenized by an optical system, for example an optical system composed of a homogenizing lens, a lens and a reflex lens firstly, and then, the homogenized laser 110 illuminates the ridge structure 108. Therefore, the energy of laser illumination on each part of the ridge structure is equal. Or, the laser 110 is focused at a point or a line through an optical system, for example an optical system composed of a series of lenses and reflex lenses, and then, the laser 110 illuminates the ridge structure 108. Therefore, the energy of the laser is enhanced or increased, or the laser is limited to illuminate predetermined part of the ridge structure only, for example the upper part of the ridge structure.

Furthermore, when the laser illumination is performed, depending on the requirement of the process, the non-SOI substrate 100 can be put on a substrate with room temperature, a substrate with high temperature, or a substrate with low temperature to perform laser illumination. The non-SOI substrate is put on the substrate with high temperature to perform laser illumination or irradiation for helping to melt the ridge structure quickly. Therefore, the process time is reduced. The non-SOI substrate is put on the substrate with low temperature to perform laser illumination or irradiation for helping to dispersing heat from the ridge structure. Therefore, it can prevent the non-SOI substrate from damage caused by excessive heat. The temperature of the substrate with high temperature is in a range of room temperature to 1200° C. Furthermore, for avoiding the laser to illuminate the portion of the ridge structure which does not need to be melted and reshaped, for example the lower part of the ridge structure, a photo mask or a mask formed by photolithography is used to cover the areas on the non-SOI substrate which have no need of the laser illumination before the laser illumination. The areas of the laser illumination on the non-SOI substrate (it means that the areas on the non-SOI substrate having a need of laser illumination) are defined by this way for limiting the laser to illuminate the desired or defined areas on the non-SOI substrate (or the ridge structure).

Referring to FIG. 1G and FIG. 2B, the structure 112, which is formed after the ridge structure 108 is melted and reshaped, comprises a broad upper part 112a and a narrow lower part 112b. The upper part of ridge structure 108 is melted because of the laser illumination, and then, it becomes the broad upper part 112a having a circular cross-section structure, an elliptical cross-section structure, or a similar cross-section structure by surface tension. The lower part of ridge structure 108 is not melted and reshaped because there is only a little of laser illumination or not any laser illumination performed on the lower part of ridge structure 108. Therefore, there is no change in the shape of the lower part of ridge structure 108 or only a little change in the shape of the lower part of ridge structure 108, and the narrow lower part 112b has the same shape or almost the same shape with the shape of the lower part of ridge structure 108. Accordingly, the width of the broad upper part 112a is greater than the width of the narrow lower part 112b. The width of the widest portion of the broad upper part 112a of the structure 112 is in a range of 100 nm to 5 µm, the width of the narrowest portion of the narrow lower part 112b of the structure 112 is in a range of 10 nm to 3 µm, and the height of the narrow lower part 112b of the structure 112 is in a range of 50 nm to 10 µm.

Figure 1H:
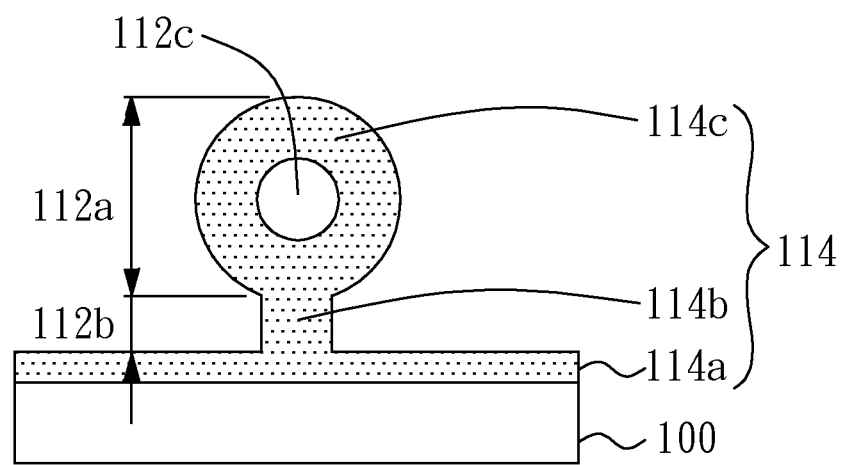

Finally, referring to FIG. 1H, an oxidizing process is performed to oxidize the non-SOI substrate 100 and the structure 112 thereon. Then, an oxide layer 114 is formed on the non-SOI substrate 100 and the structure 112. Particularly, the surface of the non-SOI substrate 100, full of the narrow lower part 112b, and the periphery part (or portion) of the broad upper part 112a are oxidized to form the oxide layers 114a, 114b and 114c respectively in order to form a silicon waveguide 112c. In this oxidizing process, when full of the narrow lower part 112b is oxidized, the core inside the broad upper part 112a remains un-oxidized to form a silicon core structure as a silicon waveguide. It is because the width of the broad upper part 112a is much greater than the width of the narrow lower part 112b and the oxidizing rate of the broad upper part 112a is equal to the oxidizing rate of the narrow lower part 112b. The substrate loss can be reduced because the silicon waveguide 112c is covered by the oxide layer 114c and full of narrow lower part 112b is oxidized to be the oxide layer 114b. The item "substrate loss" means the loss of light caused by the light coupling to non-SOI substrate from the silicon waveguide 112c. The oxidizing process is performed by dry oxidation under high temperature, wet oxidation under high temperature, or oxidation by chemical method according to requirement of the process. The width of the core (or the silicon waveguide 112c) of the broad upper part 112a of the structure 112 is in a range of 50 nm to 5 µm, and the height of the narrow lower part 112b still remains in the range of 50 nm to 10 µm.

Figure 2C:
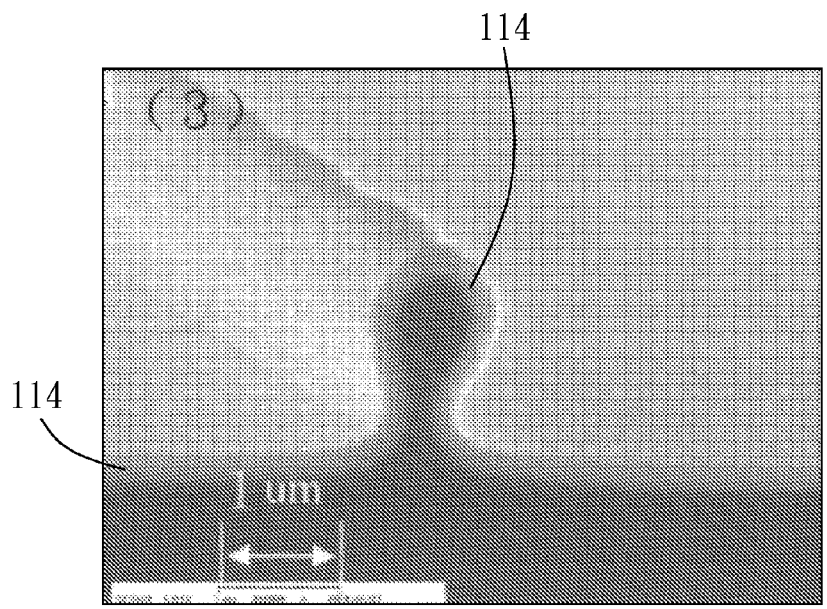
Figure 2D:
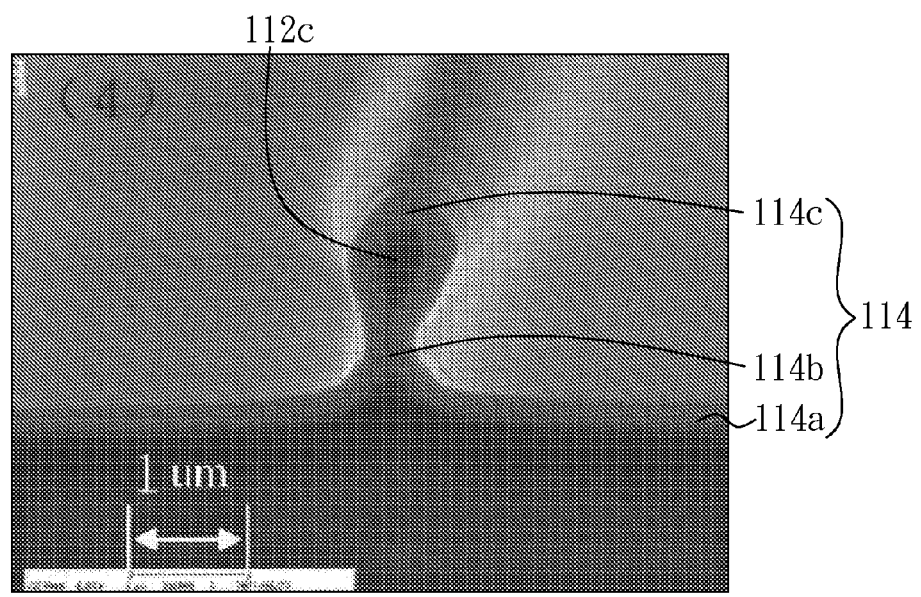

Furthermore, in this oxidizing process, the surface of the non-SOI substrate 100, full of the narrow lower part 112b, and the periphery part (or portion) of the broad upper part 112a are oxidized several times or multi-oxidized to form a silicon waveguide covered by the oxide layer except the non-SOI substrate 100 and the structure 112 is oxidized once to form an oxide layer thereon with a predetermined thickness. In multi-oxidizing process, the oxide layer is removed from the non-SOI substrate 100 and the structure 112 after first oxidizing process (as FIG. 2C shows), and then, the non-SOI substrate 100 and the structure 112 are oxidized again. The removing step and the oxidizing step are repeated until the desired silicon waveguide is formed (as FIG. 2D shows). It means that full of the narrow lower part 112b, and the periphery part (or portion) of the broad upper part 112a are oxidized but the core of broad upper part 112a is not oxidized. Therefore, for reducing the process time or increasing the speed of the process or in the situation that the width of the narrow lower part 112b is too great, the multi-oxidizing process is obviously better choice for oxidizing the non-SOI substrate 100 and the structure 112.

In the process for producing silicon waveguides, it is easy for particles to accumulate on the surfaces of the non-SCA substrate 100 and the structure 112. Therefore, the removing step in the multi-oxidizing process is helpful to remove and reduce the particles accumulating on the surfaces, and it is an advantage of the multi-oxidizing process. Furthermore, after the silicon waveguide is finished, a nitride layer, for example silicon nitride, is formed on the oxide layer to cover thereon by plasma enhanced chemical vapor deposition (PECVD), vacuum evaporation, or other deposition methods for stabilizing the silicon waveguide. Although there is only a ridge structure, a structure having the broad upper part and the narrow lower part, or a silicon waveguide illustrated in above-mentioned description and drawings, its purpose is to simplify the drawings are simplified for interpreting this invention easily and clearly. In fact, a plurality of ridge structures, structures having the broad upper part and the narrow lower part, or silicon waveguides can be formed on the non-SOI substrate simultaneously.

Therefore, according to disclosures of above-mentioned embodiments, this invention provides a method for producing silicon photonic devices (such as silicon waveguides) on non-SOI substrate. By this method, the silicon photonic device can be produced on common silicon substrate (or silicon wafer) instead of the expensive SOI substrate for reducing the cost for producing the silicon photonic device. Furthermore, the substrate loss is reduced because the silicon waveguide produced by this method is covered by an oxide layer. Therefore, the silicon photonic device (such as silicon waveguides) and the electronic device (or semiconductor device) can be produced on the same silicon substrate and it is advantageous to integrate the silicon photonic device with the electronic device.

What is claimed is:

1. A method for producing silicon waveguides on non-SOI substrate (non-silicon-on-insulator substrate), comprising:
    (1) forming a ridge structure with aspect ratio in range of 1/50 to 1000 on said non-SOI substrate;
    (2) melting and reshaping said ridge structure by laser illumination for forming a structure having an upper part and a lower part wherein said upper part is broader than said lower part; and
    (3) oxidizing said lower part of said structure and peripery part of said upper part of said structure to form a silicon waveguide.

2. The method of claim 1, wherein said non-SOI substrate is a silicon (Si) wafer or a silicon (Si) substrate.

3. The method of claim 1, wherein said step (1) comprises:
    forming a photoresist on said non-SOI substrate;
    patterning said photoresist to define a area for forming said ridge structure and to define width of said ridge structure;
    forming a metal layer on surface of said non-SOI substrate in said area for forming said ridge structure;
    removing said photoresist; and
    performing an etching process by using said metal layer as a mask to remove a predetermined thickness of said non-SOI substrate which is uncovered by said metal layer in order to form said ridge structure.

4. The method of claim 3, wherein said etching process is performed by wet etching, dry etching, reactive ion etching, laser assisted imprinting or laser cutting.

5. The method of claim 3, wherein said predetermined thickness is height of said ridge structure.

6. The method of claim 1, wherein height of said ridge structure is in a range of 100 nm to 10 μm.

7. The method of claim 1, wherein width of said ridge structure is in a range of 10 nm to 5 μm.

8. The method of claim 1, wherein said laser used in said step (2) is a gas laser, solid state laser, or diode laser.

9. The method of claim 1, wherein said laser used in said step (2) is homogenized by an optical system to make energy of laser illumination on each part of said ridge structure to be equal.

10. The method of claim 1, wherein irradiation direction of said laser used in said step (2) is in a range of 0 degree to 90 degree.

11. The method of claim 1, wherein in said step (2), said laser is focused at a point or a line through an optical system in order to enhance energy of said laser or limit said laser only to illuminate on predetermined part of said ridge structure.

12. The method of claim 1, wherein said step (2) is performed in vacuum, atmosphere, noble gas or reactive gas.

13. The method of claim 12, wherein said reactive gas is oxygen or nitrogen.

14. The method of claim 1, wherein in said step (2), said non-SOI substrate is put on a substrate with room temperature for laser illumination or irradiation.

15. The method of claim 1, wherein in said step (2), said non-SOI substrate is put on a substrate with high temperature for helping to melt said ridge structure, and said high temperature is in a range of room temperature to 1200° C.

16. The method of claim 1, wherein in said step (2), said non-SOI substrate is put on a substrate with low temperature to help dispersing of heat from said ridge structure, and said low temperature is below room temperature.

17. The method of claim 1, wherein said step (2) further comprises forming a photo mask or a photoresist produced by photolithography to cover said non-SOI substrate or said ridge structure for defining and limiting an area of laser illumination.

18. The method of claim 1, wherein width of widest portion of said upper part of said structure is in a range of 100 nm to 5 μm.

19. The method of claim 1, wherein width of narrowest portion of said lower part of said structure is in a range of 10 nm to 3 μm.

20. The method of claim 1, wherein height of said lower part of said structure is equal to or higher than 50 nm but lower than 10 μm.

21. The method of claim 1, wherein said step (3) is performed by dry oxidation, wet oxidation, or oxidation by chemical method.

22. The method of claim 1, wherein width of a core of said upper part of said structure is in a range of 50 nm to 5 μm.

23. The method of claim 1, wherein in said step (3), said structure having said upper part and said lower part is oxidized several times or multi-oxidized.

24. The method of claim 23, wherein said step of oxidizing said structure having said upper part and said lower part several times or multi-oxidizing said structure having said upper part and said lower part comprises:
 (a) removing oxide layer previously formed on said structure;
 (b) oxidizing said structure for forming another on said structure; and
 (c) repeating said step (a) and said step (b) until said silicon waveguide is formed.

25. The method of claim 1, further comprising a step of forming a nitride layer on a oxide layer, which is formed in step (3), to cover said oxide layer for stabilizing said silicon waveguide.

* * * * *